March 9, 1965 G. F. FISHER 3,173,035

MINIATURIZED PIEZOELECTRIC CRYSTAL DEVICE

Filed Oct. 17, 1960

INVENTOR.
George F. Fisher
BY
Hovey, Schmidt, Johnson & Hovey
ATTORNEYS.

United States Patent Office 3,173,035

Patented Mar. 9, 1965

3,173,035

MINIATURIZED PIEZOELECTRIC CRYSTAL DEVICE

George F. Fisher, Parkville, Mo., assignor to Midland Manufacturing Company, Division of Pacific Industries, Inc., San Francisco, Calif., a corporation of California Filed Oct. 17, 1960, Ser. No. 63,009
8 Claims. (Cl. 310—9.1)

This invention relates generally to the field of miniaturized piezoelectric crystal apparatus and more particularly to an improved apparatus and method for making the same.

The present invention is an improvement over my copending application Serial No. 831,877, now Patent No. 3,047,749, and is a further advancement in the program therein referred to, to develop modular circuit structures of hitherto unknown miniaturization of volume, minimization of weight and optimization of ruggedness, reliability and performance.

The task of developing miniaturized piezoelectric apparatus is fraught with many problems. For instance, the dimensioning of the piezoelectric crystal itself is critical in determining its frequency, and it should be kept in mind that the crystal has an approximate diameter of .19 of an inch. The thickness of the crystal element is of course dependent upon the resonant frequency desired but is kept within a range requiring that a wafer which surrounds and contains the crystal be no more than .03 of an inch in thickness. Furthermore, the arrangement for mounting the crystal within the wafer is to an extent critical because it must not damp or restrict the crystal against vibration at the desired frequency. A piezoelecric crystal of the thickness and diameter described is an extremely delicate and fragile item and must be guarded against possible physical damage which would destroy its usefulness.

The magnitude of problems surrounding the effort to achieve the maximum miniaturization can be appreciated when it is realized that the over-all dimensions of the finished assembly is approximately .03 of an inch by .3 by .3, or a maximum dimension of .0027 cubic inch. Further, the piezoelectric crystal apparatus in the assembly must be capable of resonance at frequencies from the order of 120 megacycles on down to about 7 megacycles or lower.

Accordingly, it is the primary object of this invention to provide miniaturized piezoelectric crystal apparatus and a method of making the same which will overcome the problems mentioned above and fulfill all of the requirements, particularly those of size.

It is another important object of the invention to provide miniaturized piezoelectric crystal apparatus miniaturized to the extent outlined above which will be characterized by a high degree of performance, efficiency and reliability.

It is a further object of the present invention to provide piezoelectrical crystal apparatus of sufficient ruggedness to be capable of use under extreme conditions of shock, vibration and the like which might be present, for example, in missiles or military equipment.

It is a further object of the present invention to provide miniaturized piezoelectric crystal apparatus which is adapted to be conveniently combined with other miniaturized electrical components.

Other important objects of the present invention inherent in the structure thereof will become apparent and made clear as a description of this invention proceeds.

It is to be understood that in illustrating and describing an exemplary, preferred embodiment of the present invention reference will be made to certain specific dimensions and materials utilized in the preferred construction, but that those skilled in the art may manifestly use differing dimensions or equivalent materials to meet the requirements of any particular application.

It will be further apparent that various details of the construction may be modified or otherwise changed without departing from the spirit of the invention or the scope of the appended claims.

Figure 1:
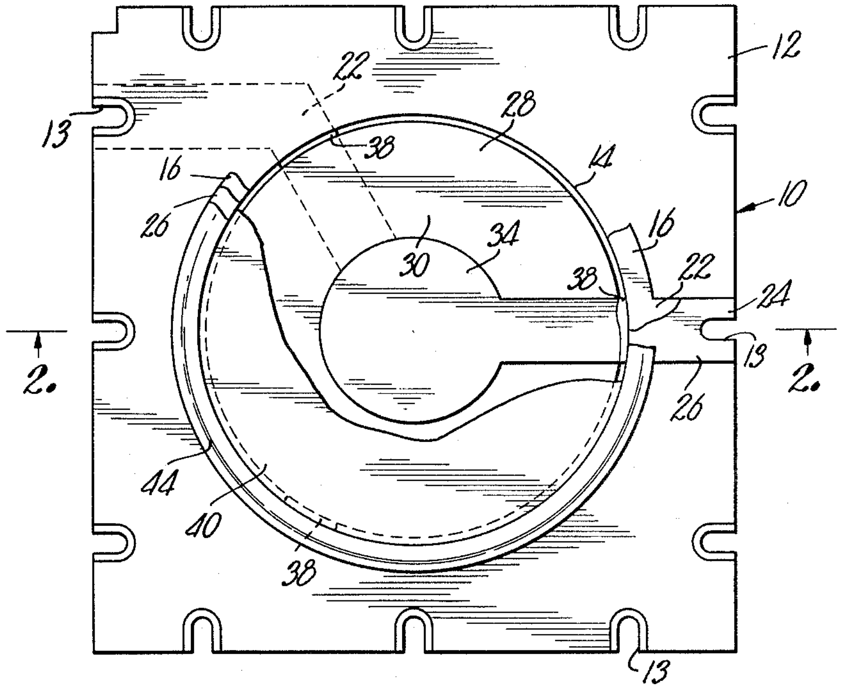
FIGURE 1 is a top plan view of a piezoelectric crystal apparatus having portions broken away to show details of construction.

Referring now to the drawings, and to FIG. 1 in particular, a miniaturized piezoelectrical crystal apparatus is shown and indicated generally by the numeral 10. Apparatus 10 includes a wafer 12 preferably made of a ceramic material having a plurality of notches 13 in the outer margins thereof. Although the notches 13 are useful for a specific purpose which will become apparent as this description proceeds, it should be pointed out at this point that they are also useful in adapting the wafer 12 for combination with other miniaturized components having similar notches therein.

Wafer 12 is provided with a circular opening 14 therethrough which is disposed centrally of the wafer 12. It should be noted for purposes of visualizing the size of the apparatus described that the size of the wafer is roughly .3 of an inch square by .01 of an inch thick and that the hole 14 described is approximately .2 of an inch in diameter.

Figure 2:
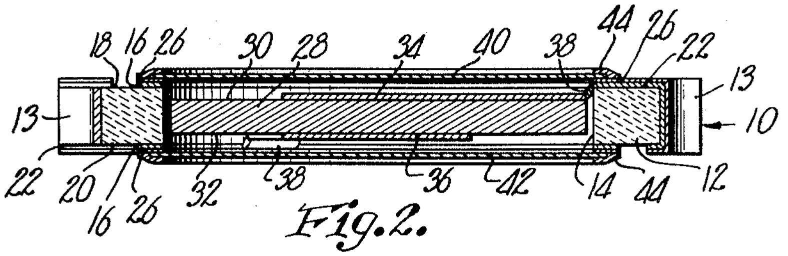
FIG. 2 is a transverse cross-sectional view taken along line 2—2 of FIG. 1.

As can be most easily seen by referring to FIG. 2, a peripheral ring or band 16 is deposited on the upper and lower faces 18 and 20, respectively, of the ceramic wafer in circumscribing relationship to the opening 14 therethrough. The ring is preferably an alloy of a solder tinnable electrically conductive material and is more particularly preferably composed of moly-manganese, nickel and copper deposited in a manner which will be more particularly described as this specification proceeds and cured to form the alloy. It should be further noted at this point that the alloy is extremely thin and in reality is only a film and that the cross-sectional dimensions shown in FIG. 2 are extremely exaggerated in order to render the apparatus capable of description. Ring 16 is further provided with a lead 22 extending radially outwardly from the outer periphery of the ring 16 and terminating at one of the notches 13 in the wafer in a bifurcated portion 24 surrounding the notch 13. It should be noted at this point that the lower ring 16 also has a lead 22 indicated in FIG. 1 in dotted line which extends radially outwardly from the outer periphery of the ring and which terminates at a different one of the notches 13 than the lead 22 which is on the upper face 18 of the wafer.

Over the ring 16 in superimposed relationship a layer of solder 26 is deposited which, by virtue of its superimposed relationship, is also in circumscribing relationship to the opening 14 in the wafer 12. Inasmuch as the construction on both faces 18 and 20 of the wafer is identical, the same numbers are being given to the same or equivalent parts on face 20 as are applied to the parts on face 18.

Again referring particularly to FIG. 2, a piezoelectric crystal element 28 is shown disposed entirely within the opening 14 and being of a lesser diameter than the opening 14, whereby the element 28 is disposed in spaced relation to the inner periphery of the opening 14. It should be noted that the element 28 is preferably a quartz crystal element the thickness of which is relative to the desired resonant frequency but which has a diameter of approximately .19 of an inch and the material of which is preferably quartz. The element is preferably an AT-cut or a BT-cut.

The total thickness of the element is such that the element may fit entirely within the wafer of dimensions previously described.

Element 28 has oppositely facing surfaces 30 and 32 corresponding generally to oppositely facing surfaces 18 and 20 of the wafer. There is plated on each of the surfaces 30 and 32 electrodes 34 and 36 of electrically conductive material, preferably such as aluminum, silver or gold, and of a thickness approximately within the range of 5,000 to 10,000 angstrom units. Again it should be realized that the thickness has been greatly exaggerated in the illustration in FIG. 2 to render the plating capable of illustration.

As previously mentioned, the element 28 having the electrodes 34 and 36 plated thereon must be supported for resonant vibration within opening 14 in a manner which will not damp the vibration of the element, thereby destroying its effectiveness and at the same time in a manner which adequately supports the element. For this purpose a plurality of drops of a non-tinnable epoxy adhesive thermosetting material indicated generally by the numerals 38 are inserted between the element 28 and more particularly between the electrodes 34 and 36 and annular ring 16. The drops are applied by stylus in a liquid condition and later hardened in a manner which will be described as the specification proceeds. The epoxy is preferably saturated with powdered silver and is electrically conductive to provide an electrical interconnection between the electrodes 34 and 36, respectively, and the annular ring 16 on the upper and lower surfaces 18 and 20 of the wafer. Each of the rings 16 having leads 22 extending radially therefrom, it can be seen that the element 28 is now electrically interconnected with notches 13 in the outer margins of the wafer.

It is extremely important that the element 28 and the electrodes thereon be sealed from exposure to the atmosphere to protect them from dust and other foreign objects and to prevent damage to the element, and for this purpose a pair of upper and lower closure caps 40 and 42, respectively, are provided. The closure caps 40 and 42 may be made of metal, in which case the caps may be sweated to the solder layer 26 by the application of additional solder, indicated by the number 44, around the outer periphery of the closure caps 40 and 42, thereby sealing the entire apparatus against contact with foreign objects except on the exposed surfaces of the wafer and the cap.

Figure 3:
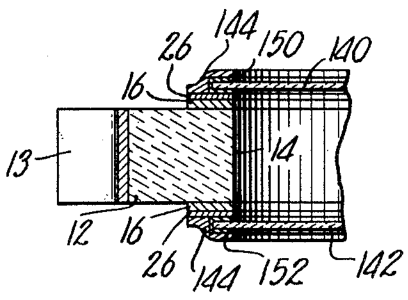
FIG. 3 is an enlarged, cross-sectional view similar to that in FIG. 2 showing a modified embodiment of the present invention.

It is perfectly acceptable to have closure caps as indicated in FIG. 3 which are ceramic and indicated by the numbers 140 and 142 and when such is the case a peripheral ring of alloy indicated generally by the numbers 150 and 152, respectively, must be deposited on the caps 140 and 142 which are composed generally of the same alloy as ring 16 of moly-manganese, nickel and copper and which is applied in the same manner. The closure caps 140 and 142 may then be sweated to the solder ring 26 by application of more solder 144 and heat to sweat the covers on. The same closing and sealing relationship is obtained as is shown in the embodiment of FIG. 2.

It will be understood that other components may be electrically connected with the crystal apparatus above described simply by soldering or otherwise connecting a wire from the other electrical components to the notches 13 to which the leads are directed and that physical interconnection may be made through other of the notches 13 where there are no leads 22.

With the parts being of extremely miniaturized dimension as has been described and, by virtue of their diminutive size, extremely fragile, the method of producing and assembling the various parts of the assembly becomes important in itself.

The first step will normally involve te deposit or affixing of the metal alloy ring 16 and the leads 22 which extend therefrom on the surfaces 18 and 20 of the ceramic wafer. This is accomplished by firing moly-manganese onto the wafer surfaces at a temperature of approximately 1500 degrees centigrade in a hydrogen atmosphere, and then separately sintering nickel and copper on the moly-manganese. After the moly-manganese, nickel and copper have been applied the entire alloy is cured at a temperature of approximately 850 degrees centigrade for approximately 15 minutes. It should be noted again that the alloy affixed by this proces to the faces 18 and 20 of the wafer is extremely thin, having been exaggerated in the drawings for purposes of illustration and that in reality it is only a film of solder-tinnable electrically conductive material.

The next step may be applying a layer of solder 26 in superimposed relationship upon the alloy layer 16. The solder layer 26 is preferably formed of a solder composed of 60 percent lead, 37 percent tin and 3 percent silver and may be thought of as a tinning film.

The crystal element 28, which is preferably of AT-cut or BT-cut quartz, is cut and ground to the diameter and thickness required to fit a particular wafer and to produce a desired resonant frequency. Electrodes are plated upon the surfaces 30 and 32 of the crystal 28 by an evaporative process and are preferably of aluminum, silver or gold, all of which are electrically conductive. The process involves suspending the metal in an easily evaporable solution and evaporating sufficient of the material, to plate on the crystal electrodes of a thickness of approximately 5,000 to 10,000 angstrom units.

The crystal element 28 is then emplaced within the opening 14 in the wafer and it is to be understood that its diameter has been ground to be slightly less than that of the opening so that the outer periphery of element 28 is in spaced relation to the margins of opening 14. Upper and lower drops of non-tinnable epoxy adhesive are then inserted by a stylus between the electrodes 34 and 36, respectively, and rings 16 on upper and lower surfaces 18 and 20, respectively. The drops are preferably saturated with powdered silver and of a thermosetting type and are applied in liquid state and then cured at approximately 150 degrees centigrade for about one hour. The drops 38 are then in a hardened condition as illustrated in the drawings and support the element 28 through the electrodes 34 and 36 for resonant vibration and at the same time electrically interconnect the electrodes 34 and 36 and the respective leads 22 as illustrated in FIG. 1.

If metal closure caps are used the assembly is now ready for sealing and this is accomplished by preheating the wafer 10, the element 28, electrodes 34 and 36, rings 16 and solder 26 to a temperature just below the melting point of solder and the metal caps are sweated onto the solder ring 26 by application of additional solder, as indicated at 44, and heat. If such a process is followed the entire crystal apparatus will be sealed against exposure to the outside and ready for use in combination with other electrical components.

On the other hand, a slightly different process may be followed for sealing the apparatus if it is desired to use ceramic caps as illustrated in FIG. 3 at 140 and 142. The ceramic caps 140 and 142 may have affixed to the outer periphery thereof a peripheral ring of metal alloy. The metal alloy is preferably comprised of moly-manganese fired onto the periphery of the ceramic cap at approximately 1500 degrees centigrade in a hydrogen atmosphere and then successive layers of nickel and copper separately sintered on. The layers of moly-manganese, nickel and copper are then cured at about 850 degrees centigrade for about 15 minutes to form the alloy peripheral film on the ceramic caps 140 and 142. The entire assembly then may be preheated as previously described and the film 150 and 152 sweated to the respective layers 26 of solder by the addition of further solder 144 and heat.

From the illustrative description and drawings of the preferred embodiment chosen as exemplary of the application of the principles of both the method and apparatus aspects of the invention, it will be clear to those skilled in the art that certain minor modifications and variations may be employed without departing from the essence and true spirit of the invention. Accordingly, it is to be understood that the invention should be deemed limited only by the fair scope of the claims that follow and equivalents thereof.

Having thus described the invention what is claimed as new and desired to be secured by Letters Patent is:

1. In miniaturized piezoelectric crystal apparatus:
an electrically nonconductive wafer having opposed major surfaces and an opening therethrough communicating said surfaces;
an electrically conductive band on each of said surfaces respectively in circumscribing relationship to said opening;
a relatively thin piezoelectric element having opposed major faces and provided with electrode structure on each of said faces respectively;
electrically conductive means coupled with the electrode structures and each of the bands and suspending the element in said opening for piezoelectric vibration therein; and
a closure cap secured to each of said bands respectively in sealing and closing relationship to the opening in the wafer.

2. The invention of claim 1, wherein said means comprises an electrically conductive component rigid with and spanning the distance between each electrode structure respectively and a corresponding band.

3. The invention of claim 2, wherein each of said electrode structures extends from the center portion of the corresponding face to a terminus at the periphery of the element, each of said components being rigid with the corresponding structure at said terminus thereof.

4. The invention of claim 2, wherein said components are relatively narrow and in sufficiently spaced relationship around the periphery of the element to suspend the latter in said opening for said piezoelectric vibration therein.

5. The invention of claim 1, wherein said band is composed of an alloy fired and sintered into adhering relationship to said wafer and a layer of solder superimposed over said alloy, said closure caps being metal and being sweated on said solder layer, whereby the closure caps close and seal the opening in said wafer on oppositely facing sides thereof.

6. The invention of claim 1, wherein said band is composed of an alloy fired and sintered into adhering relationship to said wafer and a layer of solder superimposed over said alloy, said closure caps being ceramic and being of lesser dimension than said wafer and greater dimension than said opening, said closure caps having peripheral rings of metal alloy fired and sintered into adhering relationship with said caps, the peripheral rings being sweated to said solder layer, whereby the closure caps close and seal the opening in said wafer on oppositely facing sides thereof.

7. In miniaturized piezoelectric crystal apparatus:
an electrically nonconductive wafer having opposed major surfaces and an opening therethrough communicating said surfaces;
an electrically conductive lead on each of said surfaces respectively and having a terminus at the edge of said opening;
a relatively thin piezoelectric element having opposed major faces and provided with electrode structure on each of said faces respectively; and
means suspending said element in said opening for piezoelectric vibration therein, said means comprising an electrically conductive component rigid with and spanning the distance between each electrode structure respectively and a corresponding terminus, whereby to support the element and electrically connect the electrode structures with corresponding leads.

8. The invention of claim 7, wherein said components are composed of epoxy resin impregnated with a powdered, electrically conductive substance.

References Cited in the file of this patent

UNITED STATES PATENTS

| | | |
|---|---|---|
| 2,222,056 | Williams | Nov. 19, 1940 |
| 2,771,663 | Henry | Nov. 27, 1956 |
| 2,820,911 | Klingsporn | Jan. 21, 1958 |
| 2,910,766 | Pritikin | Nov. 3, 1959 |
| 2,912,605 | Tibbetts | Nov. 10, 1959 |
| 3,073,975 | Biglel et al. | Jan. 15, 1963 |